(12) United States Patent
Hanzawa et al.

(10) Patent No.: US 6,538,866 B1
(45) Date of Patent: Mar. 25, 2003

(54) CIRCUIT FOR PROTECTING A LOAD FROM AN OVERVOLTAGE

(75) Inventors: Keiji Hanzawa, Mito (JP); Masahiro Matsumoto, Hitachi (JP); Fumio Murabayashi, Urizuramachi (JP); Tatsumi Yamauchi, Hitachiota (JP); Hiromichi Yamada, Hitachi (JP); Kohei Sakurai, Hitachi (JP); Atsushi Miyazaki, Mito (JP)

(73) Assignees: Hitachi, Ltd., Tokyo (JP); Hitachi Car Engineering Co., Ltd., Hitachinaka (JP)

( * ) Notice: Subject to any disclaimer, the term of this patent is extended or adjusted under 35 U.S.C. 154(b) by 0 days.

(21) Appl. No.: 09/526,737

(22) Filed: Mar. 16, 2000

(30) Foreign Application Priority Data

May 25, 1999 (JP) .............................. 11-145347

(51) Int. Cl.[7] ................................................ H02H 9/00
(52) U.S. Cl. .......................... 361/91.1; 361/56; 361/111
(58) Field of Search ........................ 361/56, 111, 91.1, 361/86

(56) References Cited

U.S. PATENT DOCUMENTS

| | | | | |
|---|---|---|---|---|
| 5,287,241 A | * | 2/1994 | Puar | 361/56 |
| 5,579,200 A | * | 11/1996 | Rajkanan et al. | 361/111 |
| 5,825,601 A | * | 10/1998 | Statz et al. | 361/56 |
| 5,930,170 A | * | 7/1999 | Kunst et al. | 365/185.18 |
| 6,111,737 A | * | 8/2000 | Baldwin et al. | 361/91.1 |
| 6,212,050 B1 | * | 4/2001 | Haider | 361/86 |
| 6,239,958 B1 | * | 5/2001 | Kato et al. | 361/56 |

FOREIGN PATENT DOCUMENTS

JP          9-307361          11/1997

* cited by examiner

Primary Examiner—Stephen W. Jackson
(74) Attorney, Agent, or Firm—Crowell & Moring LLP

(57) ABSTRACT

A circuit for protecting a load from an overvoltage can be integrated together with the load on the same chip by an MOS transistor manufacture process. This overvoltage protecting circuit is composed of a surge protection circuit, an overvoltage detecting circuit and a switching circuit. The surge protection circuit including two MOS transistors operates so that a surge voltage applied to a power supply receiving terminal is clamped by virtue of the source-drain breakdown voltage of the two MOS transistors, thereby absorbing the surge energy. The overvoltage detecting circuit including two MOS transistors operates so that a DC voltage supplied from the surge protection circuit is monitored with the source-drain voltage of the two MOS transistors taken as a reference voltage, thereby detecting an overvoltage. An overvoltage detection output brings an MOS transistor of the switching circuit into a turned-off condition to protect the load.

29 Claims, 9 Drawing Sheets

CIRCUIT FOR PROTECTING A LOAD FROM AN OVERVOLTAGE

BACKGROUND OF THE INVENTION

The present invention relates to a circuit for protecting a load from an overvoltage which may possibly be applied from a power supply, and more particularly to an overvoltage protecting circuit for circuit elements with relatively low withstand voltage such as MOS transistors used as electronic parts for sensors, control equipments or the like to be mounted on vehicles.

Electronic circuits mounted on vehicles such as automobiles or motor vehicles are required to operate under the presence of relatively large variations in power supply voltage. Therefore, various overvoltage protecting circuits have hitherto been used. One of those circuits is a circuit, as shown in FIG. 10, which uses a Zener diode ZD1 and a current limiting resistor RA1.

The circuit shown in FIG. 10 is one kind of general constant voltage circuit in which by virtue of a voltage applied to a power supply receiving terminal VCC, a current is caused to flow in the Zener diode ZD1 through the current limiting resistor RA1. Even when an overvoltage is applied, the voltage of a load power supply terminal VCCS is clamped by the Zener voltage of the Zener diode ZD1, thereby providing a protection against the overvoltage.

In the circuit of FIG. 10, however, so long as the overvoltage is applied, a large current continues to flow through the resistor RA1 and the Zener diode ZD1 with remarkable heat generation. When the application of the overvoltage extends over a long time, there is a fear that the Zener diode results in breakdown.

In a first method for suppressing such fear of breakdown, the electric capacity of the Zener diode ZD1 and the resistor RA1 is made large so as to be sufficiently-proof against an overcurrent. There is a second method in which the resistance value of the current limiting resistor RA1 is made large.

However, the first method is not preferable since it brings about the increase in size and cost of parts. In the second method, on the other hand, a voltage drop caused by the current limiting resistor RA1 becomes large to narrowly restrict an operating voltage range in which a constant voltage characteristic based on the Zener diode ZD1 is obtained. Further, the large voltage drop caused by the current limiting resistor RA1 deteriorates a voltage variation or regulation characteristic even in a normal operating condition. Accordingly, the second method is not also preferable.

As one prior art, JP-A-9-307361 has proposed an overvoltage protecting circuit which uses an overvoltage detecting circuit composed of a resistor and a Zener diode and a switching circuit composed of bipolar transistors.

The overvoltage protecting circuit disclosed by JP-A-9-307361 is provided for the purpose of protection of a microwave EFT (Field Effect Transistor). When an overvoltage exceeding the sum of the Zener voltage of the Zener diode and the base-emitter voltage of the switching transistor is applied to a power supply receiving terminal, the switching circuit is operated so that a load is cut off from a power supply line to protect the load.

SUMMARY OF THE INVENTION

The prior art mentioned above has a problem that the IC configuration or implementation of the circuit is not taken into consideration and the application to a protecting circuit for automobile control IC is therefore difficult.

Namely, control IC's and signal processing circuit IC's for sensors presently used in automobiles are dominated by IC's based on the integration of MOS transistors. However, in the overvoltage protecting circuit of the above-mentioned prior art, the bipolar transistors and the Zener diode are used as circuit elements. Therefore, it is difficult to apply the prior art to a protecting circuit for automobile control IC. In the following, this will be described in detail.

In general, a control IC is constituted by an integrated circuit formed using an MOS transistor manufacture process. Accordingly, in order that a protecting circuit for such a control IC is also accepted in the same chip to attain the reduction in size and cost, it is preferable that the protecting circuit can be realized in like manner by use of a standard MOS transistor manufacture process.

However, the standard MOS transistor manufacture process used for IC's such as general microcomputers does not include a process step for forming a Zener diode and bipolar transistors. Therefore, the application of the above-mentioned prior art to a protecting circuit for automobile control IC requires the addition of another manufacture process. As a result, such application is difficult.

Also, when an overvoltage protecting circuit is to be realized by a CMOS process for microcomputers, it is necessary to take a special measure against a latch-up phenomenon peculiar to CMOS transistors. In the above-mentioned prior art, however, this is not taken into consideration.

Further, electronic parts such as microcomputers for control and sensors are generally applied with a power supply voltage of about 5 V. In the case where they are used in an automobile, it is necessary to use a regulation circuit so that a voltage regulated from a battery voltage (normally about 12 V) to about 5 V is supplied as the power supply voltage.

In this case, it is desired to prevent the electronic parts from being broken down even when the regulation circuit is broken down or when the battery voltage is directly applied erroneously at the time of checking/maintenance. In the above-mentioned prior art, however, this is not taken into consideration.

Furthermore, in the case where such electronic parts are used in an automobile, its actual working environment is considerably severe or it is required to sufficiently make the protection from breakdown caused by a surge voltage and electromagnetic noises generated at an ignition system of an engine and/or the prevention of erroneous operation caused thereby. In the above-mentioned prior art, however, this is not taken into consideration.

An object of the present invention is to provide an overvoltage protecting circuit which overcomes the above-mentioned problem of the prior art and is suitable for integration or IC circuit configuration.

To attain the above object, the present invention provides an overvoltage protecting circuit comprising an overvoltage detecting circuit for detecting the appearance of an overvoltage by comparing a voltage of a power supply receiving terminal with a reference voltage, and a switching element connected between the power supply receiving terminal and a load power supply terminal and on/off controlled in accordance with an output signal of the overvoltage detecting circuit, the reference voltage being provided by a source-drain voltage of an MOS transistor.

The overvoltage protecting circuit of the present invention can be provided with the following construction.

(1) A diffused resistor is connected in series with the MOS transistor.

(2) At least the overvoltage detecting circuit and the switching element are formed, together with a load connected to the load power supply terminal, on the same chip by an MOS transistor manufacture process.

(3) At least the switching element and transistors included in the overvoltage detecting circuit are constituted by PMOS transistors.

(4) The transistor may include a high withstand voltage MOS transistor for EPROM.

(5) A path extending from the power supply receiving terminal to the load power supply terminal through the switching element is provided in a form divided into at least two or more systems. One overvoltage detecting circuit may serve for the two or more systems.

(6) A shunt element is connected in parallel between the load power supply terminal and the ground.

(7) An internal or integral power supply is provided between the load power supply terminal and the ground. The internal power supply may include a condenser.

(8) At least the switching element includes the series connection of at least two MOS transistors.

(9) The load formed on the same chip may comprise a signal processing chip including at least an analog circuit, a logic circuit and a memory circuit.

(10) The load formed on the same chip may comprise a sensor chip including at least an analog circuit, a logic circuit, a memory circuit and a sensor element.

DESCRIPTION OF THE EMBODIMENTS

Embodiments of an overvoltage protecting circuit of the present invention will now be described in detail by use of the drawings.

Figure 1:
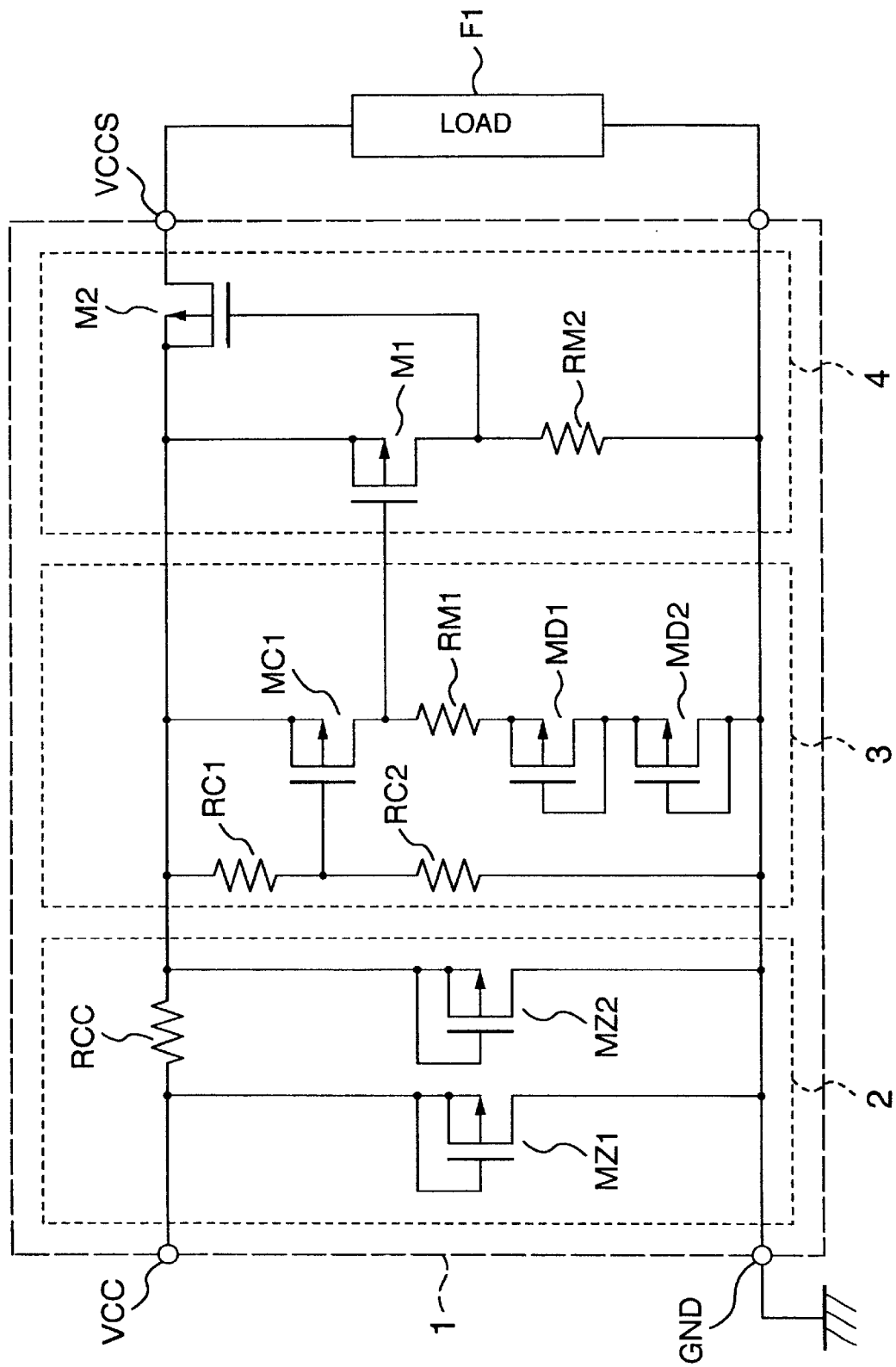
FIG. 1 is a circuit diagram showing an overvoltage protecting circuit according to an embodiment of the present invention.

FIG. 1 shows an overvoltage protecting circuit 1 according to an embodiment of the present invention. The overvoltage protecting circuit 1 is constituted by a surge protection circuit 2, an overvoltage detecting circuit 3 and a switching circuit 4. The supply of a DC power from an automobile battery (not shown) is received through a power supply receiving terminal VCC and a ground terminal GND so that an electric power protected against an overvoltage is supplied to a load F1 connected to a load power supply terminal VCCS.

The surge protection circuit 2 is composed of P-type MOS transistors MZ1 and MZ2 and a resistor RCC. By virtue of the BVDS (source-drain breakdown voltage) of the two MOS transistors MZ1 and MZ2, a surge voltage applied to the power supply receiving terminal VCC is clamped to absorb the surge energy.

The overvoltage detecting circuit 3 is composed of P-type MOS transistors MC1, MD1 and MD2 and resistors RC1, RC2 and RM1. With the VDS (source-drain voltage) of the two MOS transistors MD1 and MD2 taken as a reference voltage, a DC voltage supplied from the surge protection circuit 2 is monitored to detect an overvoltage.

The resistors RC1 and RC2 and the MOS transistor MC1 serve as a bias source for driving a reference voltage source formed by the two MOS transistors MD1 and MD2.

The switching circuit 4 is composed of P-type MOS transistors M1 and M2 and a resistor RM2. When an overvoltage is detected by the overvoltage detecting circuit 3, a voltage is applied to the gate of the MOS transistor M2 through the MOS transistor M1 to control or bring the MOS transistor M2 into a turned-off condition, thereby cutting off the load power supply terminal VCCS from the power supply receiving terminal VCC.

Next, the operation of the present embodiment shown in FIG. 1 will be described.

As mentioned above, the MOS transistors MD1 and MD2 of the overvoltage detecting circuit 3 serve as the reference voltage source for holding the gate voltage of the MOS transistor M1 at a fixed voltage so that the MOS transistor M2 is normally kept at a turned-on condition.

If an overvoltage requiring a protection therefrom (about 7 V when the load F1 is a CMOS circuit) is applied between the power supply receiving terminal VCC and the ground terminal GND, a voltage is applied between the gate and the source of the MOS transistor M1 so that the MOS transistor M1 is turned on.

Thereby, a voltage between the gate and the source of the MOS transistor M2 is decreased. As a result, the MOS transistor M2 is turned off to cut off a power supply line for the load F1 so that the overvoltage is prevented from being applied to the load F1 from the load power supply terminal VCCS. Thus, the function of making a protection against the overvoltage is exhibited.

Figure 2:
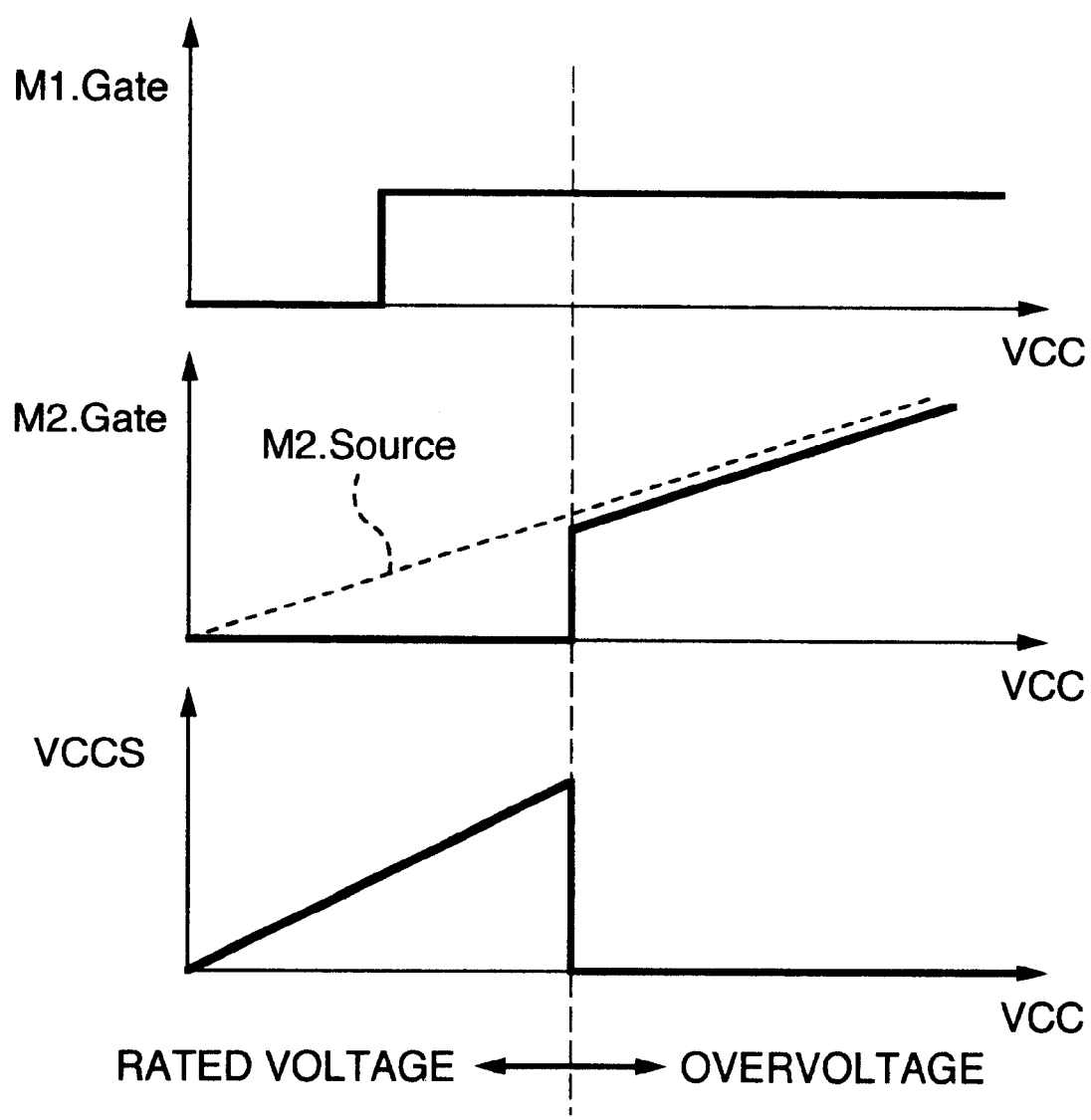
FIG. 2 shows characteristic diagrams for explaining the operation of the overvoltage protecting circuit in the embodiment of the present invention.

The operating characteristic in the above operation is shown in FIG. 2.

In the embodiment shown in FIG. 1, all circuit elements are constituted by MOS transistors and diffused resistors. Therefore, it is possible to form the overvoltage protecting circuit through only a general CMOS transistor manufacture process which requires no special manufacture process.

In the case where the load F1 is formed on the basis of an MOS transistor manufacture process, it is also possible to integrate the overvoltage protecting circuit together with the load F1 on the same chip. In other words, the present embodiment can easily be applied to control IC's or signal processing circuit IC's for sensors used in automobiles.

In the present embodiment, the MOS transistors forming the overvoltage protecting circuit are all constituted by P-type MOS transistors. Therefore, it is possible to prevent a latch-up phenomenon peculiar to a CMOS circuit.

In the present embodiment, high withstand voltage MOS transistors can be used as the MOS transistors in the overvoltage protecting circuit. Therefore, the present embodiment can easily be applied to the case where the load F1 to be protected is incorporated with high withstand voltage MOS transistors for EPROM or the like as in a one-chip microcomputer. Thereby, it is possible to obtain a protection which endures a high voltage and has a high reliability.

In the embodiment shown in FIG. 1, the reference voltage source is formed by the two MOS transistors MD1 and MD2. Accordingly, the reference voltage is defined by the source-drain voltage (VDS) of the MOS transistors MD1 and MD2. An overvoltage is detected with this VDS taken as a threshold value. Therefore, when the VDS changes, the reference voltage may change correspondingly.

The VDS of the MOS transistors MD1 and MD2 has a negative temperature coefficient. Namely, when the temperature is increased, the VDS is decreased. To the ontrary, when the temperature is decreased, the VDS is increased.

In the present embodiment, on the other hand, the resistor RM1 is connected in series with the MOS transistors MD1 and MD2. This resistor RM1 is formed as a diffused resistor. Namely, the resistor RM1 can be formed with a positive temperature characteristic. According to the present embodiment, therefore, a temperature compensation for the reference voltage is automatically provided, thereby making it possible to obtain a high-precision protection against overvoltage always.

Next, an overvoltage protecting circuit according to another embodiment of the present invention will be described in reference to FIG. 3.

Figure 3:
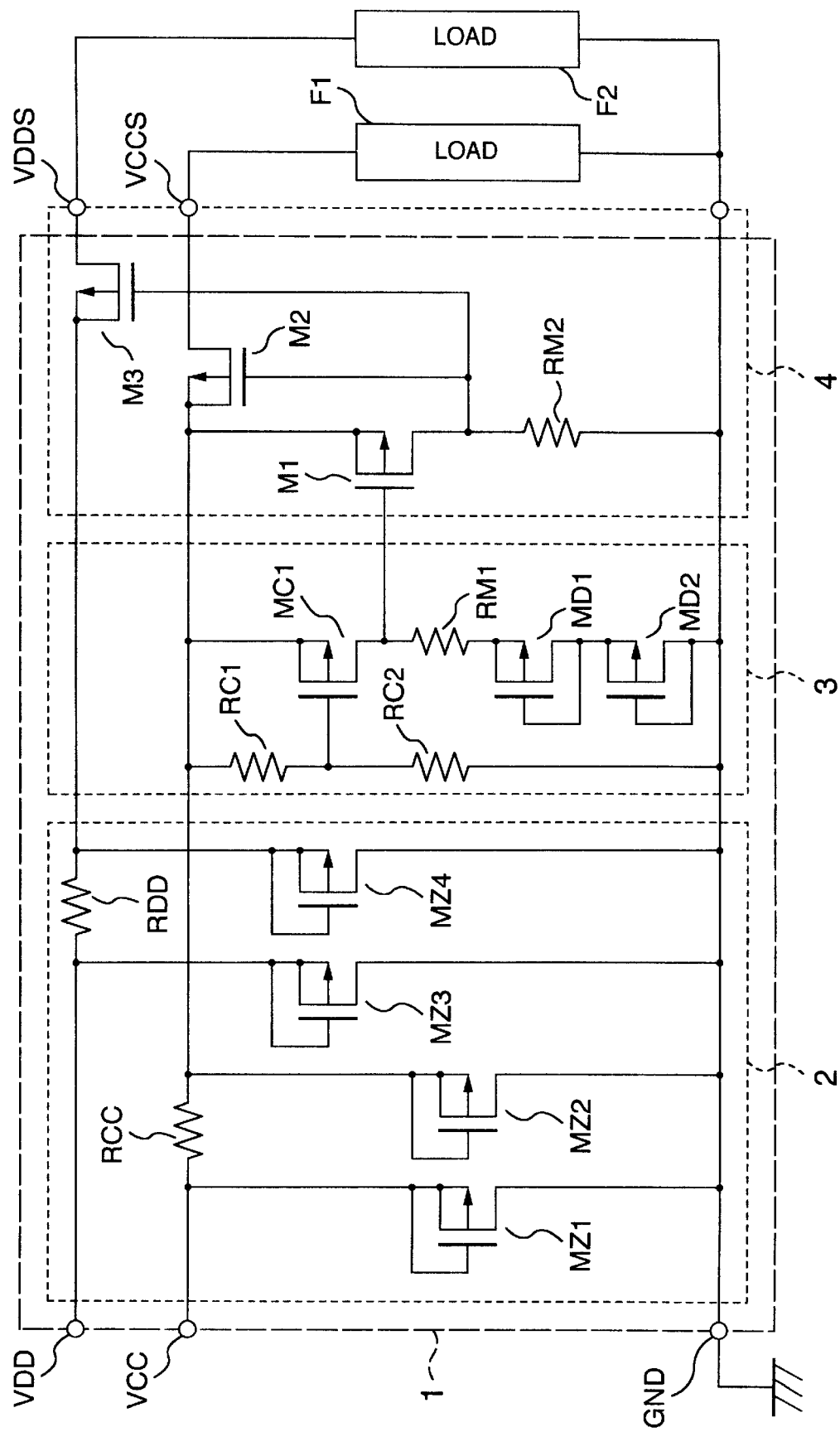
FIG. 3 is a circuit diagram showing an overvoltage protecting circuit according to another embodiment of the present invention.

In the embodiment shown in FIG. 3, power supply systems and loads are provided in a form divided into two systems. Namely, MOS transistors MZ3 and MZ4, a resistor RDD and an MOS transistor M3 are added to the embodiment shown in FIG. 1.

From another power supply receiving terminal VDD, a voltage is applied through the resistor RDD and the MOS transistor M3 to a load F2 connected to a load power supply terminal VDDS.

In the present embodiment too, the operation of the protecting circuit is similar to that of the embodiment shown in FIG. 1. Therefore, the description of the operation will be omitted.

According to the present embodiment, the overvoltage detecting circuit 3 and the MOS transistor M1 of the switching circuit 3 are used in common by the two systems. Therefore, the construction is correspondingly simplified, thereby enabling the reduction in cost.

For example, in an IC chip in which an analog circuit portion such as an A/D converter circuit or a D/A converter circuit and a logic circuit portion are integrated, there is the case where two separate power supply systems are respectively provided for the analog circuit portion and the logic circuit portion in order to ensure a stabilized operation. The embodiment shown in FIG. 3 can be applied to such a case. Also, this embodiment can easily cope with an IC which has a large number of terminal pins or a circuit in which analog circuit portion and a digital circuit portion coexist.

According to the embodiment shown in FIG. 3, it is possible to suppress the influence of noises from one of two kinds of loads F1 and F2 to the other. Therefore, an overvoltage protecting circuit free from the fear of an erroneous operation can easily be realized even in the case where the loads F1 and F2 are a digital circuit and an analog circuit, respectively.

In the analog circuit, its output range or precision is influenced by the value of a power supply voltage or the stability of the power supply voltage. According to the embodiment shown in FIG. 3, since a separate overvoltage protecting circuit is provided for each circuit block, there is an effect that it is possible to reduce the variations in power supply voltage at the analog circuit portion which may be caused by, for example, variations in consumed current.

Figure 4:
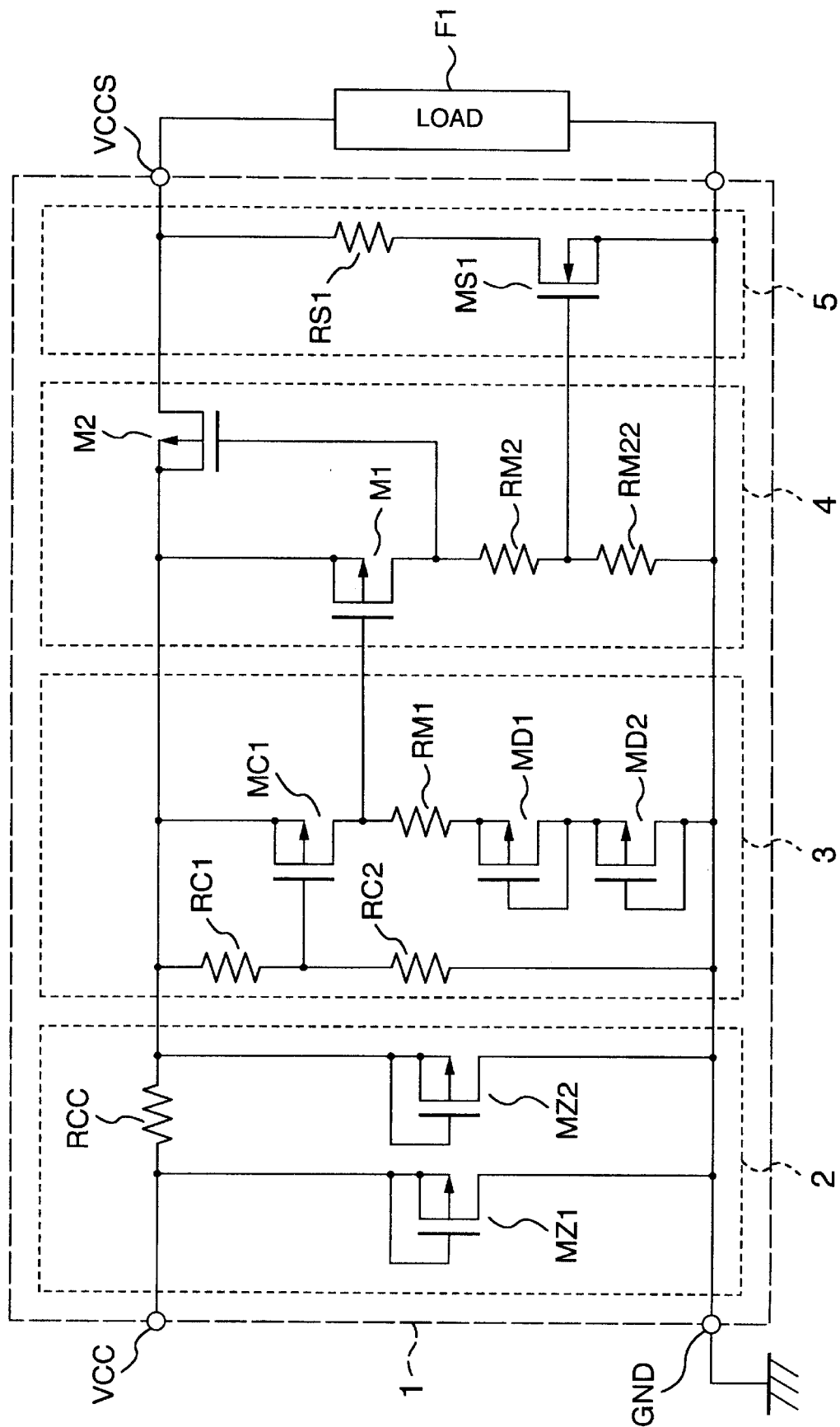
FIG. 4 is a circuit diagram showing an overvoltage protecting circuit according to a further embodiment of the present invention.

FIG. 4 shows a further embodiment of the present invention. In the present embodiment, a shunt circuit 5 is added to the embodiment shown in FIG. 1. The shunt circuit 5 is composed of a resistor RS1 and an MOS transistor MS1. Corresponding to the addition of the shunt circuit 5, a resistor RM22 is connected in series with the resistor RM2 of the switching circuit 4. Namely, the resistor RM2 is divided into two resistors.

The operation of the embodiment shown in FIG. 4 will now be described.

Now assume that an overvoltage appears at the power supply receiving terminal VCC, for example, due to the generation of a surge in the power supply system. Then, the MOS transistor M2 is turned off by a signal outputted from the overvoltage detecting circuit 3, thereby exhibiting the function of making a protection against the overvoltage. At this time, a signal outputted from the MOS transistor M1 is also applied to the gate of the MOS transistor MS1.

As a result, the load power supply terminal VCCS is cut off from the power supply receiving terminal VCC by virtue of the MOS transistor M2 while it is shunted to the ground terminal GND through the resistor RS1 by virtue of the MOS transistor MS1.

Accordingly, the embodiment shown in FIG. 4 has an effect that it is possible to surely attenuate a high-frequency surge which may possibly be transferred from the power supply receiving terminal VCC to the load power supply terminal VCCS through a parasitic capacitance existing between the drain and the source of the MOS transistor M2 as the switching element.

Figure 5:
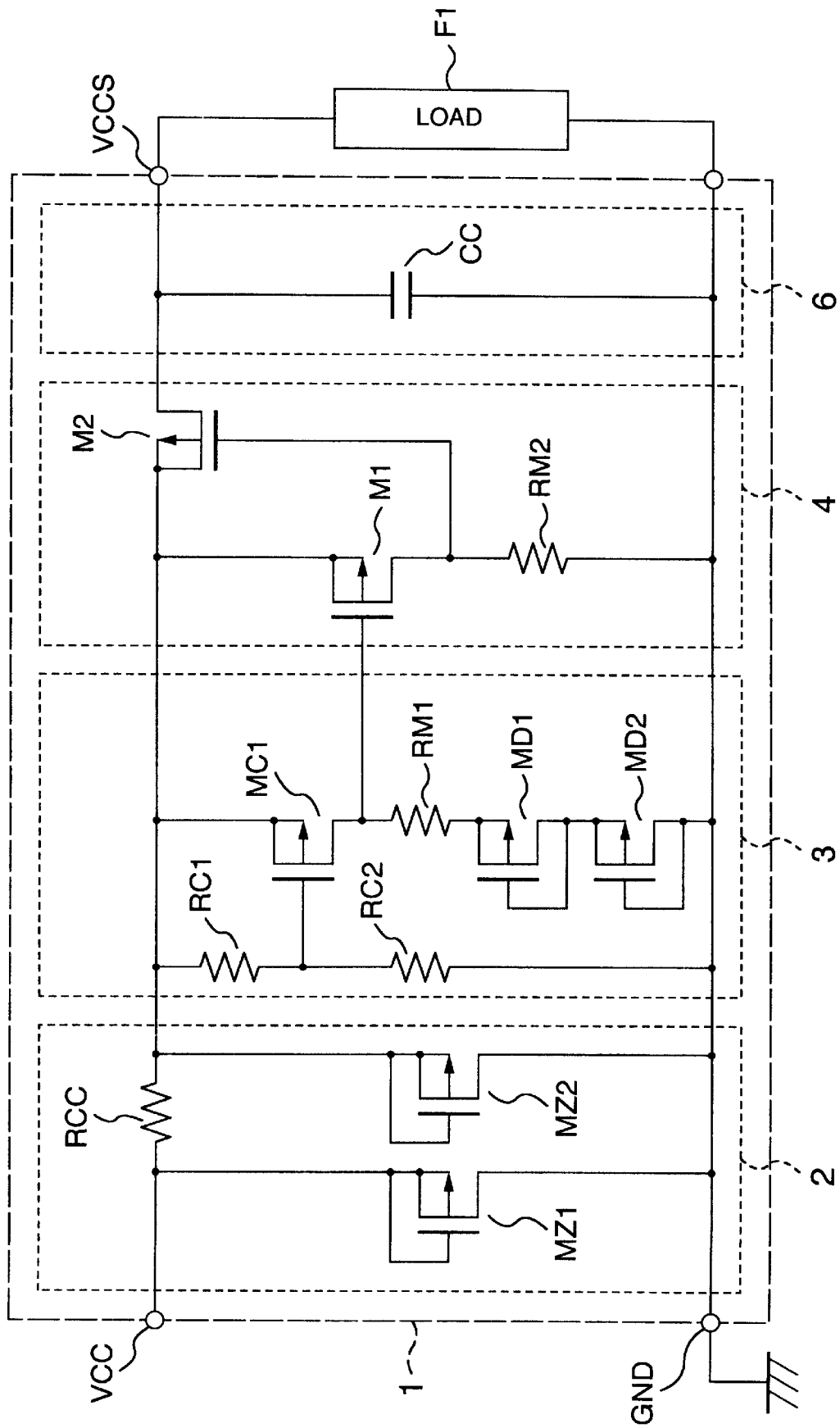
FIG. 5 is a circuit diagram showing an overvoltage protecting circuit according to a still further embodiment of the present invention.

FIG. 5 shows a still further embodiment of the present invention. In the present embodiment, a power supply stabilizing circuit 6 is added to the embodiment shown in FIG. 1. The power supply stabilizing circuit 6 includes a capacitor CC.

The overvoltage protecting circuit according to the present invention is effective in the aspect of a protecting function since it responds to even the input of a surge voltage having a very short duration of, for example, several nanoseconds to several microseconds to operate the MOS transistor M2 as the switching element into a turned-off condition. On the other hand, each time such a surge voltage is inputted, the power supply for the load F1 is cut off.

However, the embodiment shown in FIG. 5 is provided with the power supply stabilizing circuit 6 including the capacitor CC. This construction makes it possible to cause the voltage of the load power supply terminal VCCS to have little variation at the time of cut-off for a short time caused by the surge voltage. As a result, there is an effect that it is possible to maintain the operation of the load F1 normally even at the time of surge input.

Also, in the embodiment shown in FIG. 5, a filter circuit is formed by the capacitor CC and the resistor RCC of the surge protection circuit 2 when the MOS transistor M2 is placed in a turned-on condition. Therefore, the present embodiment is additionally provided with a function as the filter circuit when electromagnetic wave noises are inputted. Namely, there is an effect that the improvement in noise-proof performance can be obtained.

Further, the on-resistance of the MOS transistor M2 also serves as a part of the resistor of the filter circuit, thereby providing an effect that it is possible to sufficiently prevent the influence of electromagnetic waves onto the internal load.

Figure 6:
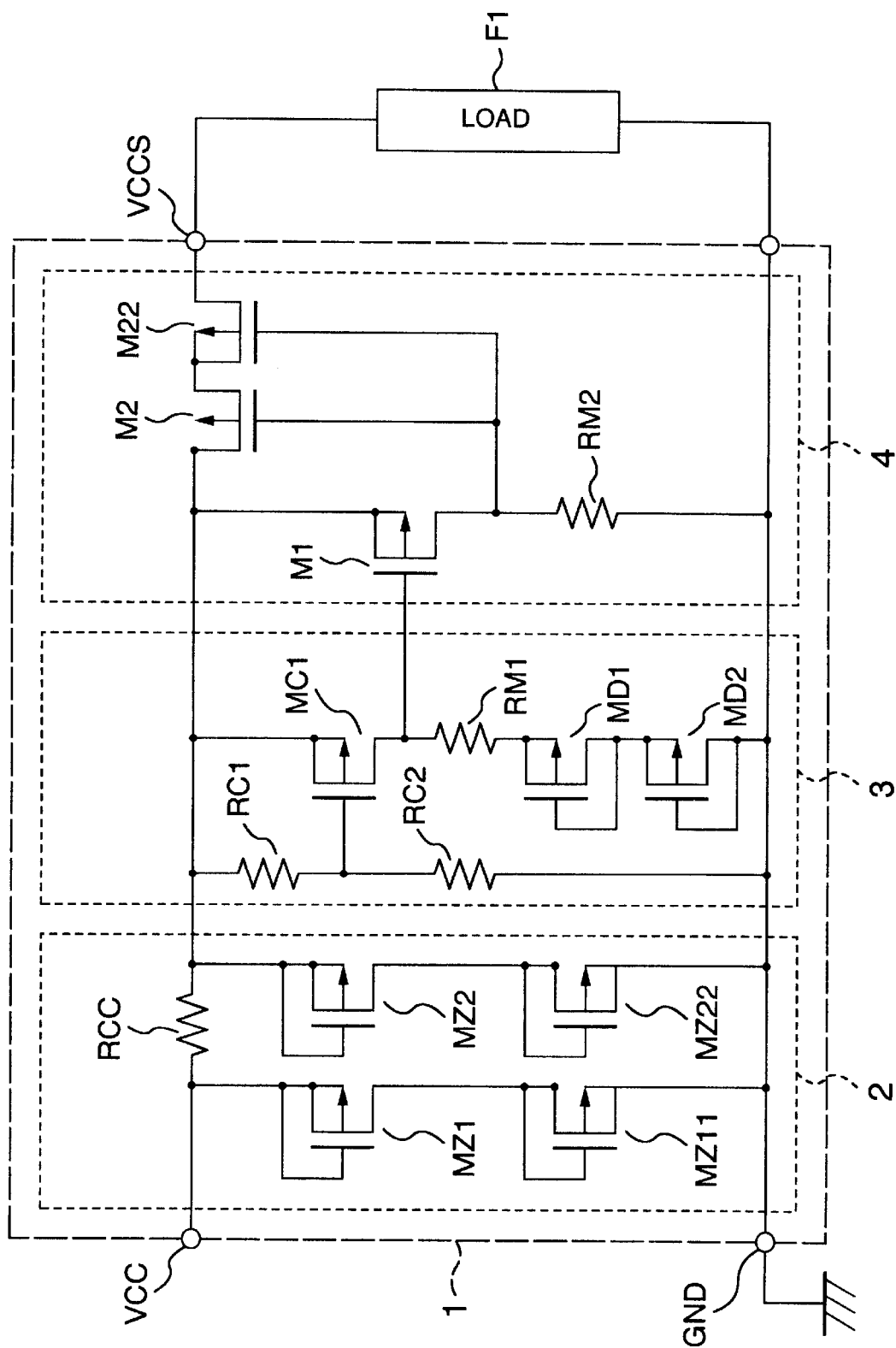
FIG. 6 is a circuit diagram showing an overvoltage protecting circuit according to a furthermore embodiment of the present invention.

FIG. 6 shows a furthermore embodiment of the present invention which is suitable in the case where the rated value of a power supply voltage is relatively high. In the present embodiment, additional MOS transistors MZ11, MZ22 and M22 are respectively connected in series with the MOS transistors MZ1 and MZ2 of the surge protection circuit 2 and the MOS transistor M2 as the switching element of the switching circuit 4 in the embodiment shown in FIG. 1.

Accordingly, the embodiment shown in FIG. 6 can provide the function of a protection against an overvoltage which is two times as high as the BVDS withstand voltage characteristic possessed by each MOS transistor. Therefore, the present embodiment can easily be applied to the case where the power supply voltage is considerably high.

The overvoltage protecting circuit according to the present invention is suitable for the protection of various electronic equipment for automobiles.

Figure 7:
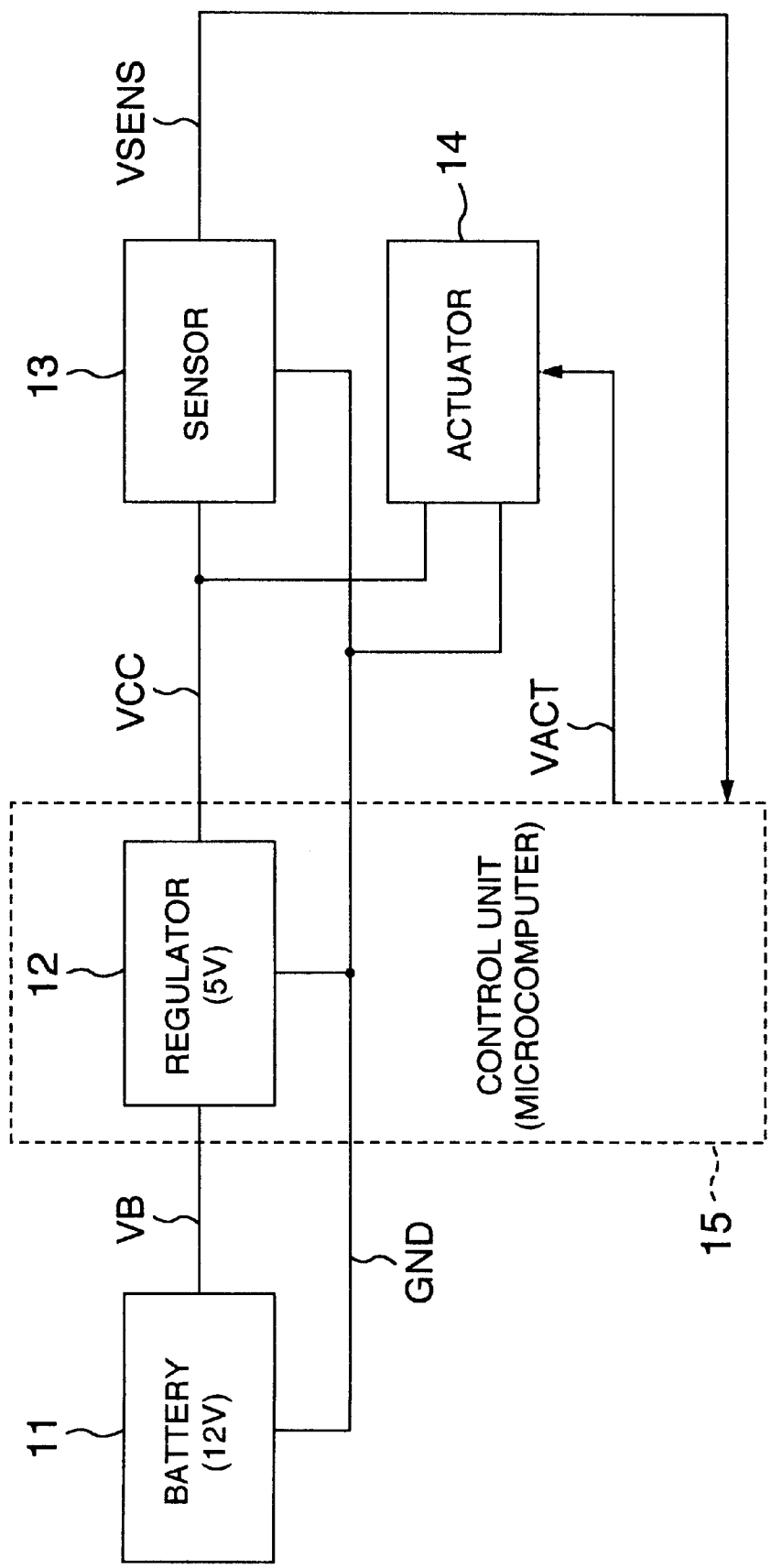
FIG. 7 is a block diagram showing an example of a system to which the overvoltage protecting circuit of the present invention is applied.

Now, an example of a system for an automobile having the overvoltage protecting circuit of the present invention mounted thereon is shown in FIG. 7.

The automobile system shown in FIG. 7 is provided with a battery 11, a regulator 12 for lowering a voltage VB (=12 V) of the battery 11 and providing it with a stabilized output, a control unit 15 including a microcomputer mounted thereon together with the regulator 12, a sensor 13 operating with the supply of a voltage VCC (=5 V) received from the regulator 12, and an actuator 14.

The sensor 13 and the actuator 14 are integrally mounted with an overvoltage protecting circuit of the present invention. Namely, in the present example, the body of the sensor 13 or actuator 14 is a load to be protected by the overvoltage protecting circuit of the present invention.

The microcomputer mounted on the control unit 15 takes in a sensor output signal VSENS from the sensor 13, operates an actuator control signal VACT on the basis of the sensor output signal, and outputs the actuator control signal to the actuator 14, thereby controlling an engine or the like.

In such an automobile system, there is a possibility that in the case where the regulator is broken due to short-circuiting, the battery voltage is applied to the sensor or actuator as it is. Also, there is a possibility that when the sensor or actuator is detached at the time of maintenance and is then inputted with a power supply for operation confirmation, the battery voltage is erroneously applied.

However, in the system shown in FIG. 7, the overvoltage protecting circuit of the present invention is integrally mounted with the sensor 13 and the actuator 14. Therefore, even if the regulator 12 is broken down, there is no fear that the battery voltage is applied to the body of the sensor 13 or the actuator 14. Also, even in the case where a high voltage is erroneously applied to the sensor 13 or the actuator 14 at the time of maintenance or the like, there is not caused a fear that the high voltage is applied to the body of the sensor 13 or the actuator 14.

Accordingly, the application of the overvoltage protecting circuit of the present invention to the automobile system as shown in FIG. 7 makes it possible to provide the function of protection against situations peculiar to automobile parts including the application of a surge or battery voltage which may be encountered by the automobile parts.

Figure 8:
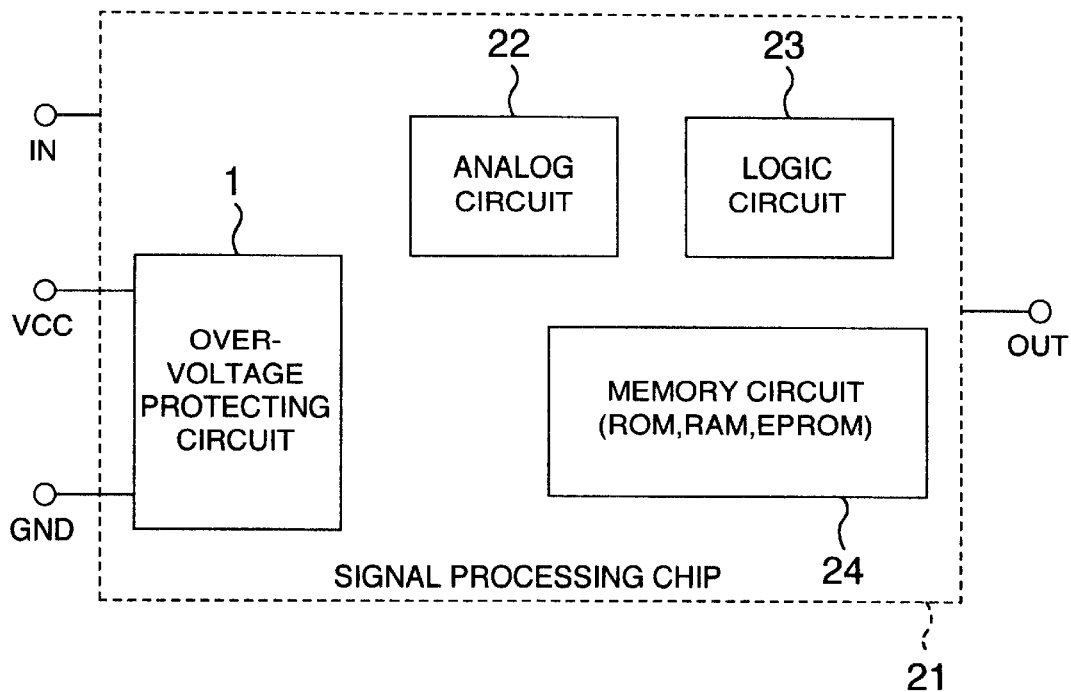
FIG. 8 is a block diagram showing another example of the system to which the overvoltage protecting circuit of the present invention is applied.

FIG. 8 shows an example of a signal processing chip having the overvoltage protecting circuit of the present invention mounted thereon.

The signal processing chip 21 shown in FIG. 8 is composed of a signal processing chip which includes an analog circuit 22, a logic circuit 23 and a memory circuit 24 and an overvoltage protecting circuit 1 of the present invention which is mounted on the signal processing chip. Namely, in the present example, the analog circuit 22, the logic circuit 23 and the memory circuit 24 are loads of the overvoltage protecting circuit 1 (for example, load F1).

The signal processing chip 21 converts an input signal IN into a digital signal by an analog/digital converter circuit (not shown) and then performs a digital operation (and thereafter makes a conversion into an analog signal, as required), thereby obtaining an output signal OUT. Programs and constants necessary for the operation are stored in the memory circuit 24. The memory circuit 24 may be constituted by ROM, RAM and EPROM, as shown.

With such application of the overvoltage protecting circuit 1 of the present invention, since the overvoltage protecting circuit 1 can be formed in the same chip as the signal processing chip 21 through a CMOS process, there is an effect that the signal processing chip can be used with no special consideration or in a manner similar to general parts even in a working environment which is severe as in the case of automobile signal processing units.

Figure 9:
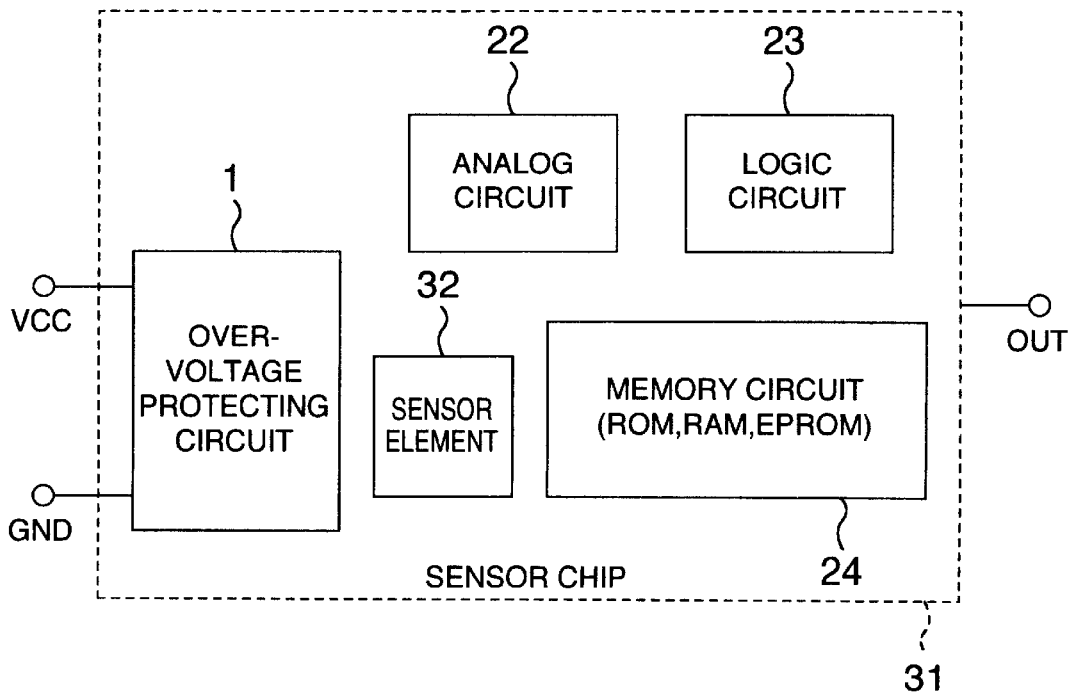
FIG. 9 is a block diagram showing a further example of the system to which the overvoltage protecting circuit of the present invention is applied.
Figure 10:
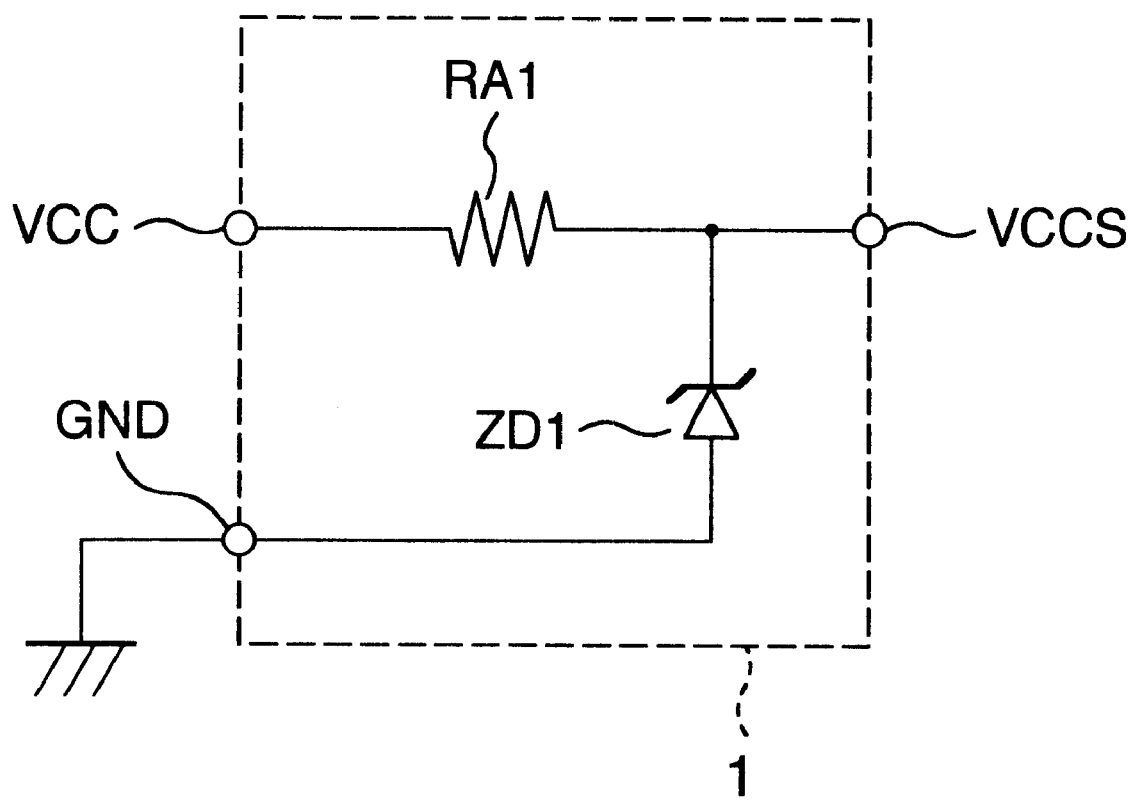
FIG. 10 is a block diagram showing an example of the conventional overvoltage protecting circuit.

FIG. 9 shows an example of a sensor chip having the overvoltage protecting circuit of the present invention mounted thereon.

The sensor chip 31 shown in FIG. 9 is composed of a sensor chip which includes an analog circuit 22, a logic circuit 23, a memory circuit 24 and a sensor element 32 and an overvoltage protecting circuit 1 of the present invention which is mounted on the sensor chip. Namely, in the present example, the analog circuit 22, the logic circuit 23, the memory circuit 24 and the sensor element 32 are loads of the overvoltage protecting circuit 1.

The sensor chip 31 converts a physical quantity such as a pressure or acceleration into an electric signal such as a resistance change signal or electrostatic capacitance change signal, makes the conversion of the electric signal as an input signal into a digital signal by an analog/digital converter circuit and then performs a digital operation (and thereafter makes a conversion into an analog signal, as required), thereby providing an output signal OUT. Programs and constants necessary for the operation are stored in the memory circuit 24 which may include memories such as ROM, RAM and EPROM.

In the sensor chip 31 shown in FIG. 9, the application of the overvoltage protecting circuit 1 of the present invention makes it possible to form the overvoltage protecting circuit 1 in the same chip as the sensor chip 31 through a CMOS process, thereby providing an effect that the sensor chip can be used with no special consideration or in a manner similar to general parts even in a working environment which is severe as in the case of automobile sensors.

According to the embodiments of the present invention, all circuits necessary for the protection against an overvoltage can be obtained by an MOS transistor manufacture process. Therefore, it becomes possible to integrate the circuits inclusive of a load on the same chip. Further, it is possible to prevent a latch-up phenomenon peculiar to a CMOS circuit.

As a result, the embodiments of the present invention provides an effect that a high reliability can be attained, the temperature compensation of a reference voltage can automatically be obtained and it is possible to easily cope with high-voltage specifications.

Also, the embodiments of the present invention makes it possible to realize an overvoltage protecting circuit having less influence of noises from a digital portion to an analog portion. Therefore, the present invention provides an effect that it is possible to reduce variations in power supply voltage which may be caused in an analog portion due to variations in consumed current or the like, and an effect that an increase in circuit scale can be suppressed.

Further, the embodiments of the present invention provides an effect that it is possible to normally operate a load even when a surge appears and it is possible to prevent the influence of electromagnetic waves onto an internal load.

The embodiments of the present invention can also provide a protection against an overvoltage exceeding the BVDS withstand voltage of an MOS transistor, thereby providing an effect that it is possible to easily cope with high-voltage specifications.

Further, the embodiments of the present invention provides an effect that it is possible to provide the function of protection against situations peculiar to automobile parts including the application of a surge or battery voltage which may be encountered by the automobile parts.

Also, the application of an overvoltage protecting circuit according to the present invention provides an effect that even parts such as automobile sensors having severe working environments can be used with no special consideration or in a manner similar to general parts.

What is claimed is:

1. An overvoltage protecting circuit comprising:
   an overvoltage detecting circuit for detecting appearance of an overvoltage by comparing a voltage of a power supply receiving terminal with a reference voltage; and
   a switching element connected between said power supply receiving terminal and a load power supply terminal and on/off controlled in accordance with an output signal of said overvoltage detecting circuit;
   wherein said reference voltage is constant and is provided by a source-drain voltage of an MOS transistor.

2. An overvoltage protecting circuit comprising:
   an overvoltage detecting circuit for detecting appearance of an overvoltage by comparing a voltage of a power supply receiving terminal with a reference voltage; and
   a switching element connected between said power supply receiving terminal and a load power supply terminal and on/off controlled in accordance with an output signal of said overvoltage detecting circuit;
   wherein said reference voltage is provided by a source-drain voltage of an MOS transistor, wherein a diffused resistor is connected in series with said MOS transistor.

3. An overvoltage protecting circuit comprising:
   an overvoltage detecting circuit for detecting appearance of an overvoltage by comparing a voltage of a power supply receiving terminal with a reference voltage; and
   a switching element connected between said power supply receiving terminal and a load power supply terminal and on/off controlled in accordance with an output signal of said overvoltage detecting circuit;
   wherein said reference voltage is provided by a source-drain voltage of an MOS transistor, wherein at least said overvoltage detecting circuit and said switching element comprise MOS transistor elements formed, together with a load connected to said load power supply terminal, on a single computer chip.

4. An overvoltage protecting circuit comprising:
   an overvoltage detecting circuit for detecting appearance of an overvoltage by comparing a voltage of a power supply receiving terminal with a reference voltage; and
   a switching element connected between said power supply receiving terminal and a load power supply terminal and on/off controlled in accordance with an output signal of said overvoltage detecting circuit;
   wherein said reference voltage is provided by a source-drain voltage of an MOS transistor, wherein at least said switching element and transistors included in said overvoltage detecting circuit are constituted by PMOS transistors.

5. An overvoltage protecting circuit according to claim 3, wherein said transistor includes a high withstand voltage MOS transistor for EPROM.

6. An overvoltage protecting circuit comprising:
   an overvoltage detecting circuit for detecting appearance of an overvoltage by comparing a voltage of a power supply receiving terminal with a reference voltage; and
   a switching element connected between said power supply receiving terminal and a load power supply terminal and on/off controlled in accordance with an output signal of said overvoltage detecting circuit;
   wherein said reference voltage is provided by a source-drain voltage of an MOS transistor, wherein a path extending from said power supply receiving terminal to said load power supply terminal through said switching element is divided among at least two systems.

7. An overvoltage protecting circuit according to claim 6, wherein one said overvoltage detecting circuit serves said at least two systems.

8. An overvoltage protecting circuit comprising:
   an overvoltage detecting circuit for detecting appearance of an overvoltage by comparing a voltage of a power supply receiving terminal with a reference voltage; and
   a switching element connected between said power supply receiving terminal and a load power supply terminal and on/off controlled in accordance with an output signal of said overvoltage detecting circuit;
   wherein said reference voltage is provided by a source-drain voltage of an MOS transistor, wherein a shunt element is connected in parallel between said load power supply terminal and the ground.

9. An overvoltage protecting circuit comprising:
   an overvoltage detecting circuit for detecting appearance of an overvoltage by comparing a voltage of a power supply receiving terminal with a reference voltage; and
   a switching element connected between said power supply receiving terminal and a load power supply terminal and on/off controlled in accordance with an output signal of said overvoltage detecting circuit;
   wherein said reference voltage is provided by a source-drain voltage of an MOS transistor, wherein an internal power supply is provided.

10. An overvoltage protecting circuit according to claim 9, wherein said internal power supply includes a capacitor.

11. An overvoltage protecting circuit comprising:
   an overvoltage detecting circuit for detecting appearance of an overvoltage by comparing a voltage of a power supply receiving terminal with a reference voltage; and a switching element connected between said power supply receiving terminal and a load power supply terminal and on/off controlled in accordance with an output signal of said overvoltage detecting circuit;

wherein said reference voltage is provided by a source-drain voltage of an MOS transistor, wherein said switching element comprises a series connection of at least two MOS transistors.

12. An overvoltage protecting circuit according to claim 3, wherein said load formed on the single chip comprises a signal processing chip including at least an analog circuit, a logic circuit and a memory circuit.

13. An overvoltage protecting circuit according to claim 3, wherein said load formed on the single chip comprises a sensor chip including at least an analog circuit, a logic circuit, a memory circuit and a sensor element.

14. An overvoltage protecting circuit according to claim 4, wherein said transistor includes a high withstand voltage MOS transistor for EPROM.

15. The overvoltage protection circuit comprising:

an overvoltage detecting circuit for detecting appearance of an overvoltage by comparing a voltage of a power supply receiving terminal with a reference voltage; and a switching element connected between said power supply receiving terminal and a load power supply terminal and on/off controlled in accordance with an output signal of said overvoltage detecting circuit; wherein said reference voltage is provided by a source-drain voltage of an MOS transistor, wherein said switching element comprises at least a MOS transistor connected in series with a path from said power supply receiving terminal to said load power supply terminal.

16. An overvoltage protecting circuit according to claim 1, wherein a diffused resistor is connected in series with said MOS transistor.

17. An overvoltage protecting circuit according to claim 1, wherein at least said overvoltage detecting circuit and said switching element comprise MOS transistor elements formed, together with a load connected to said load power supply terminal, on a single computer chip.

18. An overvoltage protecting circuit according to claim 1, wherein at least said switching element and transistors included in said overvoltage detecting circuit are constituted by PMOS transistors.

19. An overvoltage protecting circuit according to claim 3, wherein said transistor includes a high withstand voltage MOS transistor for EPROM.

20. An overvoltage protecting circuit according to claim 1, wherein a path extending from said power supply receiving terminal to said load power supply terminal through said switching element is divided among at least two systems.

21. An overvoltage protecting circuit according to claim 6, wherein one said overvoltage detecting circuit serves said at least two systems.

22. An overvoltage protecting circuit according to claim 1, wherein a shunt element is connected in parallel between said load power supply terminal and the ground.

23. An overvoltage protecting circuit according to claim 1, wherein an internal power supply is provided.

24. An overvoltage protecting circuit according to claim 9, wherein said internal power supply includes a capacitor.

25. An overvoltage protecting circuit according to claim 1, wherein said switching element comprises a series connection of at least two MOS transistors.

26. An overvoltage protecting circuit according to claim 3, wherein said load formed on the single chip comprises a signal processing chip including at least an analog circuit, a logic circuit and a memory circuit.

27. An overvoltage protecting circuit according to claim 3, wherein said load formed on the single chip comprises a sensor chip including at least an analog circuit, a logic circuit, a memory circuit and a sensor element.

28. An overvoltage protecting circuit according to claim 4, wherein said transistor includes a high withstand voltage MOS transistor for EPROM.

29. The overvoltage protection circuit according to claim 1, wherein said switching element comprises at least a MOS transistor connected in series with a path from said power supply receiving terminal to said load power supply terminal.

* * * * *